United States Patent
Ruesch et al.

(10) Patent No.: US 6,703,908 B1
(45) Date of Patent: Mar. 9, 2004

(54) I/O IMPEDANCE CONTROLLER

(75) Inventors: Rodney Ruesch, Eau Claire, WI (US); Philip N. Jenkins, Eau Claire, WI (US); Nan Ma, Chippewa Falls, WI (US)

(73) Assignee: Silicon Graphic, Inc., Mountain View, CA (US)

( * ) Notice: Subject to any disclaimer, the term of this patent is extended or adjusted under 35 U.S.C. 154(b) by 0 days.

(21) Appl. No.: 09/619,724

(22) Filed: Jul. 20, 2000

(51) Int. Cl.[7] ................................................ H03H 7/40
(52) U.S. Cl. ...................................................... 333/17.3
(58) Field of Search ................................ 333/175, 174, 333/17.3

(56) References Cited

U.S. PATENT DOCUMENTS 4,375,051 A * 2/1983 Theall .......................... 333/17
4,477,713 A   10/1984 Cook et al. ............. 219/124.34

(List continued on next page.)

OTHER PUBLICATIONS

Lattice Semiconductor Corporation, User Electronic Signature, pp. 1–3.*

"Low Power Quad Differential Line Driver with Cut–Off", *National Semiconductor, F100K ECL 300 Series Databook and Design Guide*, pp. 2–54–2–60, (1992).

"The SA27 library includes programmable delay elements DELAYMUXO and DELAYMUXN. How are these cells used?", *IBM Delaymuxn Book*, pp. 1–6, (Feb. 1999).

Djordjevic, A.R., et al., "Time Domain Response of Multiconductor Transmission Lines", *Proceedings of the IEEE*, 75(6), 743–64, (Jun. 1987).

Im, G., et al., "Bandwidth–Efficient Digital Transmission over Unshielded Twisted–Pair Wiring", *IEEE Journal on Selected Areas in Communications*, 13(9), 1643–1655, (Dec. 1995).

Mooney, R., et al., "A 900 Mb/s Bidirectional Signaling Scheme", *IEEE Journal of Solid–State Circuits*, 30(12), 1538–1543, (Dec. 1995).

Takahashi, T., et al., "110GB/s Simultaneous Bi–Directional Transceiver Logic Synchronized with a System Clock", *IEEE International Solid–State Circuits Conference*, 176–177, (1999).

*Primary Examiner*—Robert Pascal
*Assistant Examiner*—Stephen E. Jones
(74) *Attorney, Agent, or Firm*—Schwegman, Lundberg, Woessner & Kluth, P.A.

(57) ABSTRACT

There is disclosed apparatus and apparatus for impedance control to provide for controlling the impedance of a communication circuit using an all-digital impedance control circuit wherein one or more control bits are used to tune the output impedance. In one example embodiment, the impedance control circuit is fabricated using circuit components found in a standard macro library of a computer aided design system. According to another example embodiment, there is provided a control for an output driver on an integrated circuit ("IC") device to provide for forming a resistor divider network with the output driver and a resistor off the IC device so that the divider network produces an output voltage, comparing the output voltage of the divider network with a reference voltage, and adjusting the output impedance of the output driver to attempt to match the output voltage of the divider network and the reference voltage. Also disclosed is over-sampling the divider network voltage, storing the results of the over sampling, repeating the over-sampling and storing, averaging the results of multiple over sampling operations, controlling the impedance with a plurality of bits forming a word, and updating the value of the word by only one least significant bit at a time.

9 Claims, 15 Drawing Sheets

U.S. PATENT DOCUMENTS

| | | | | |
|---|---|---|---|---|
| 4,514,749 A | | 4/1985 | Shoji | 357/68 |
| 4,587,445 A | | 5/1986 | Kanuma | 307/443 |
| 4,823,184 A | | 4/1989 | Belmares-Sarabia et al. | 358/27 |
| 4,896,272 A | | 1/1990 | Kurosawa | 364/491 |
| 4,926,066 A | | 5/1990 | Maini et al. | 307/303.1 |
| 5,194,765 A | * | 3/1993 | Dunlop et al. | 307/443 |
| 5,295,132 A | | 3/1994 | Hashimoto et al. | 370/13 |
| 5,315,175 A | | 5/1994 | Langner | 307/443 |
| 5,394,528 A | | 2/1995 | Kobayashi et al. | 395/325 |
| 5,416,606 A | | 5/1995 | Katayama et al. | 358/467 |
| 5,481,567 A | | 1/1996 | Betts et al. | 375/261 |
| 5,490,252 A | | 2/1996 | Macera et al. | 395/200.1 |
| 5,521,836 A | | 5/1996 | Hartong et al. | 364/491 |
| 5,535,223 A | | 7/1996 | Horstmann et al. | 371/27 |
| 5,544,203 A | | 8/1996 | Casasanta et al. | 375/376 |
| 5,555,188 A | | 9/1996 | Chakradhar | 364/490 |
| 5,604,450 A | | 2/1997 | Borkar et al. | 326/82 |
| 5,631,611 A | * | 5/1997 | Luu | 333/17.3 |
| 5,657,346 A | | 8/1997 | Lordi et al. | 375/224 |
| 5,757,658 A | | 5/1998 | Rodman et al. | 364/491 |
| 5,778,308 A | * | 7/1998 | Sroka et al. | 455/115 |
| 5,787,268 A | | 7/1998 | Sugiyama et al. | 395/500 |
| 5,793,259 A | | 8/1998 | Chengson | 331/78 |
| 5,811,997 A | | 9/1998 | Chengson et al. | 327/112 |
| 5,828,833 A | | 10/1998 | Belville et al. | 395/187.01 |
| 5,844,954 A | | 12/1998 | Casasanta et al. | 375/373 |
| 5,847,592 A | | 12/1998 | Gleim et al. | 327/403 |
| 5,898,729 A | | 4/1999 | Boezen et al. | 375/259 |
| 5,910,898 A | | 6/1999 | Johannsen | 364/489 |
| 5,915,104 A | | 6/1999 | Miller | 395/309 |
| 5,929,717 A | * | 7/1999 | Richardson et al. | 333/17.3 |
| 6,005,895 A | | 12/1999 | Perino et al. | 375/288 |
| 6,016,553 A | | 1/2000 | Schneider et al. | 714/21 |
| 6,310,815 B1 | * | 10/2001 | Yamagata et al. | 365/230.03 |

* cited by examiner

| PIN NAME | TYPE | DESCRIPTION |
|---|---|---|
| zn | INPUT | CONTROLLER INPUT FROM Nfet REFERENCE I/O |
| zp | INPUT | CONTROLLER INPUT FROM Pfet REFERENCE I/O |
| tdr_bits[23:0] | INPUT | TEST DATA REGISTER BUS |
| sys_clk | INPUT | SYSTEM CLOCK (VERY LOW FREQUENCY) |
| sel_mid | INPUT | TEST PIN TO SET ALL OUTPUT PVT CODES TO MID COUNT |
| pvt_sys_n[7:0] | OUTPUT | 8-BIT PVT CODE GOES TO SYSTEM I/O THAT CONTROLS Nfet |
| pvt_sys_p[7:0] | OUTPUT | 8-BIT PVT CODE GOES TO SYSTEM I/O THAT CONTROLS Pfet |
| pvt_ref_n[8:0] | OUTPUT | 8.5-BIT PVT CODE GOES TO REFERENCE I/O THAT CONTROLS Nfet |
| pvt_ref_p[8:0] | OUTPUT | 8.5-BIT PVT CODE GOES TO REFERENCE I/O THAT CONTROLS Pfet |
| updn_out_n | OUTPUT | OUTPUT TEST PIN FOR Nfet CONTROL |
| updn_out_p | OUTPUT | OUTPUT TEST PIN FOR Pfet CONTROL |

Fig. 8

| PIN NAME | TYPE | DESCRIPTION |
|---|---|---|
| comp_in | INPUT | INPUT FROM REFERENCE I/O (THE COMPARATOR OUTPUT) |
| sel_filter | INPUT | CONTROL PIN TO SELECT BETWEEN DIVIDE BY 1 FILTER AND DIVIDE BY 2 FILTER |
| sel_mid | INPUT | CONTROL PIN TO SET BOTH SYSTEM AND REFERENCE I/O PVT CODE TO MID COUNT |
| sel_npfet | INPUT | CONTROL PIN TO SET THE LOGIC BLOCK TO BE Nfet OR Pfet CONTROL BLOCK |
| sel_tdr | INPUT | CONTROL PIN TO SET THE OUTPUT PVT CODE EQUAL TO tdr_bits |
| seq_bypass | INPUT | CONTROL PIN TO BYPASS THE SEQUENCER |
| sys_clk | INPUT | INPUT CLOCK (VERY LOW FREQUENCY) |
| sys_disable | INPUT | SYSTEM DISABLE SIGNAL |
| sys_reset | INPUT | SYSTEM RESET SIGNAL |
| tdr_bits<7:0> | INPUT | TEST DATA REGISTER BIT FOR PVT CODE |
| tdr_overid | INPUT | CONTROL PIN TO OVERRIDE THE comp_in WITH tdr_updn |
| tdr_updn | INPUT | INPUT SIGNAL CONTROLLED BY TDR |
| pvt_sys[7:0] | OUTPUT | 8-BIT PVT CODE GOES TO SYSTEM I/O |
| pvt_ref[8:0] | OUTPUT | 8.5 BIT PVT CODE GOES TO REFERENCE I/O |
| updn_out | OUTPUT | OUTPUT TEST PIN |

*Ideally this should be LM, compromised to M4 to IBM methodology

REpin=0 System Mode, Vref=Vext
REpin=1 Test Mode Vref=733mv

Fig. 13B

|  | | | | | | | |
|---|---|---|---|---|---|---|---|
| OUTPUTS | updn_out | c | t | b | b | b | p |
| | pvt_ref[8:0] | A | B | M | H | T | M |
| | pvt_gtl[7:0] | A | B | M | H | T | M |
| INPUTS | sel_mid | 0 | 0 | 0 | 0 | 0 | 1 |
| | sel_tdr | 0 | 0 | 0 | 0 | 1 | 0 |
| | sys_disable | 0 | 0 | 0 | 1 | - | - |
| | sys_reset | 0 | 0 | 1 | 0 | - | - |
| | sys_clk | ↺ | ↺ | ↺ | ↺ | - | - |
| | seq_bypass | - | - | - | - | - | - |
| | sel_npfet | - | - | - | - | - | - |
| | sel_filter | - | - | - | - | - | - |
| | tdr_bits | - | - | - | - | - | - |
| | tdr_overid | 0 | 1 | - | - | - | - |
| | tdr_in | - | - | - | - | - | - |
| | comp_in | - | - | - | - | - | - |

Fig. 14

I/O IMPEDANCE CONTROLLER

STATEMENT OF RIGHTS IN INVENTION

The United States Government has rights to use this invention pursuant to subcontract B338314 issued by the University of California, which operates Lawrence Livermore National Laboratory for the United States Department of Energy under Contract No. W-7405-ENG-48.

TECHNICAL FIELD OF THE INVENTION

The present invention relates generally to the field of electronics, and more particularly to an impedance controller for an electronic circuit.

BACKGROUND

Voltage, temperature, and processing causes the impedance of an output driver in an electronic circuit to vary. This variation can add noise, increase the power, and reduce the data transfer rate of the driver. In the prior art, variations in impedance due to environmental and processing parameters have been compensated for using analog circuitry, and in particular a low pass filter (LPF) to filter out a certain range of noise frequency. Such filters, however, are typically custom devices and are not available in most circuit design macro libraries. It is desirable, however, that a digital design be provided for this purpose, thus allowing the impedance compensating circuitry to be implemented with most macro libraries. Furthermore, there are other limitations in the art concerning impedance compensation that would be desirable to address, as discussed further below.

SUMMARY OF THE INVENTION

The present invention, in the various example embodiments illustrated herein, provides an all-digital impedance control circuit. This design potentially enables faster data transfer rates, quieter systems, and reduced power compensation, as compared to analog circuits for this purpose.

DETAILED DESCRIPTION OF THE DRAWINGS

In the following detailed description of the invention reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

Figure 1:
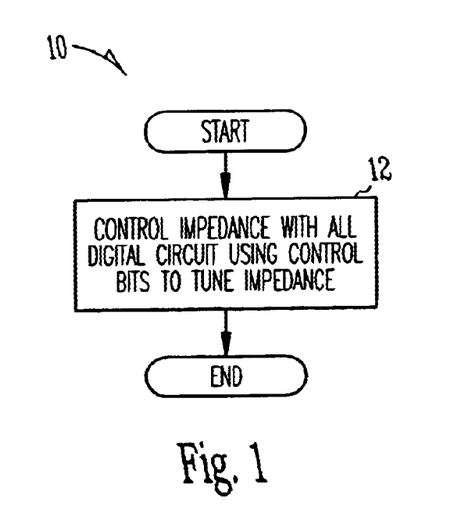
FIGS. 1–3 illustrate various example embodiments of methods according to the present invention.
Figure 2:
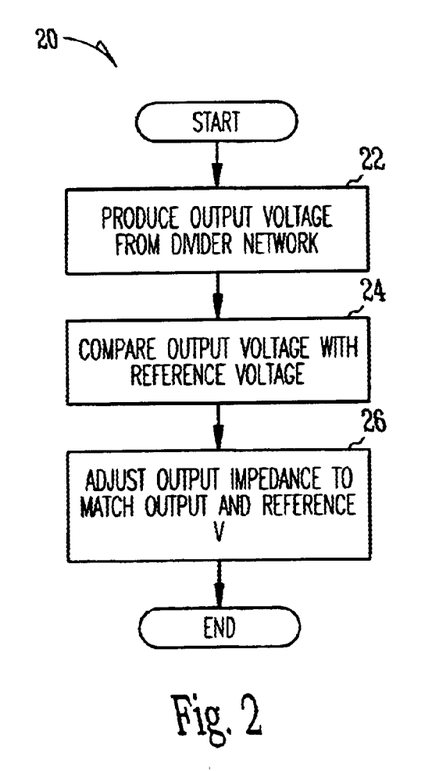
Figure 3:
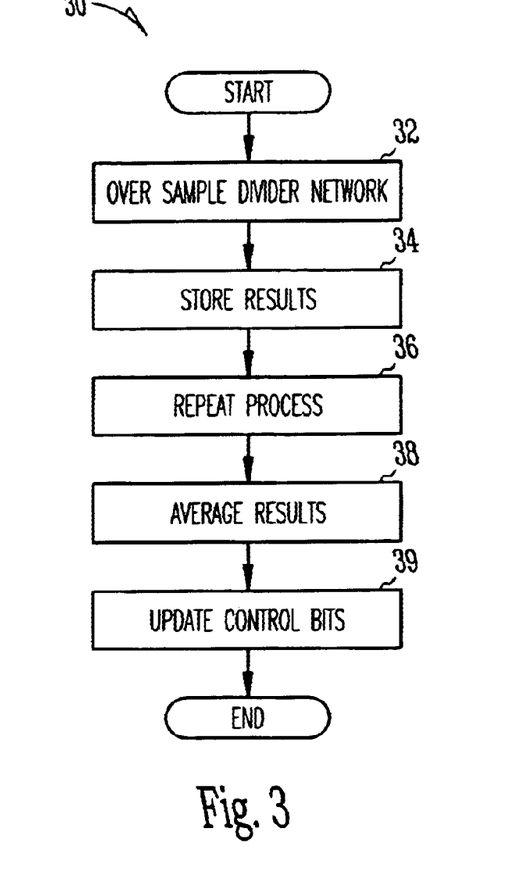

Referring now to FIGS. 1–3, there is described various example embodiments of the methods of the present invention. FIG. 1 illustrates a first example embodiment 10 of the method, wherein the impedance of a digital circuit is controlled using an all-digital impedance control circuit 12, and wherein one or more control bits are used to tune the output impedance. According to a further aspect of this embodiment, the impedance control circuit is fabricated using circuit components found in a standard macro library of a computer aided design system.

Referring now to FIG. 2, there is illustrated another example embodiment 20 of the methods of the present invention, wherein there is provided an impedance control circuit for an output driver on an integrated circuit ("IC") device. According to this embodiment, a resistor divider network is formed with the output driver and a resistor off the IC device so that the divider network produces an output voltage 22, the output voltage of the divider network is compared with a reference voltage 24, and the output impedance of the output driver is adjusted to attempt to match the output voltage of the divider network and the reference voltage 26.

According to another example embodiment 30 shown in FIG. 3, the divider network is over-sampled 32, the results are stored 34, this process is repeated 36, and the results are averaged over multiple over sampling operations 38. The impedance is controlled with a plurality of bits forming a word, and the value of the word is updated by only one least significant bit at a time 39. According to one example aspect of this method, a sequencer is used to determine when to update the bits. According to another example aspect, the sequencer is disabled to monitor the updating of the bits or to cause all updates to be sent to system drivers. According to yet another example aspect an impedance controller circuit carries out the above-described methods, and the controller is monitored and overridden by test data registers. According to yet another example aspect, a mid count is used to bypass the sampler for test purposes during system operation.

Figure 4:
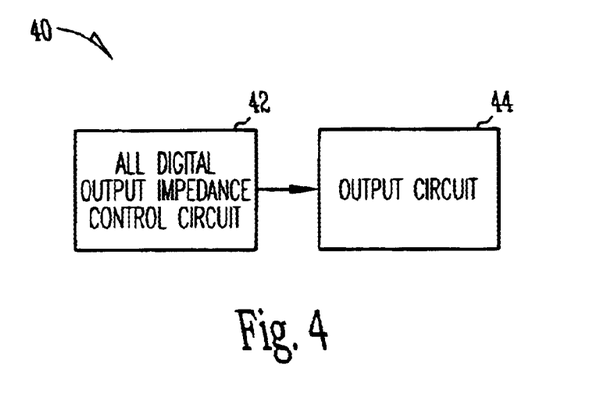
FIGS. 4–6 illustrate various example embodiments of apparatus according to the present invention.
Figure 5:
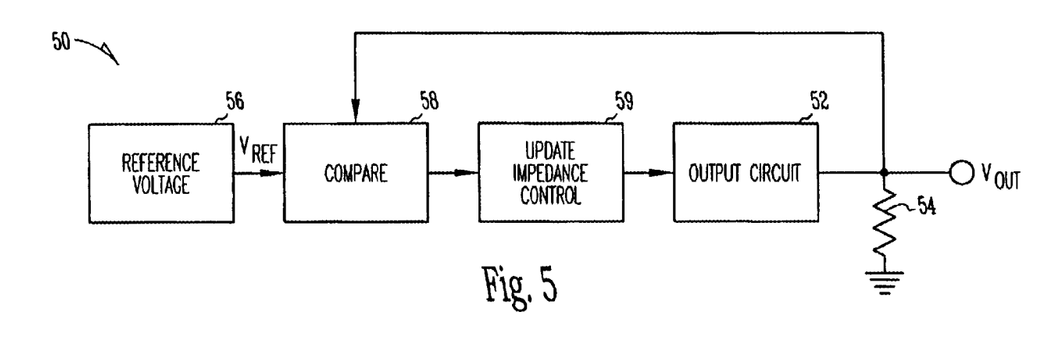
Figure 6:
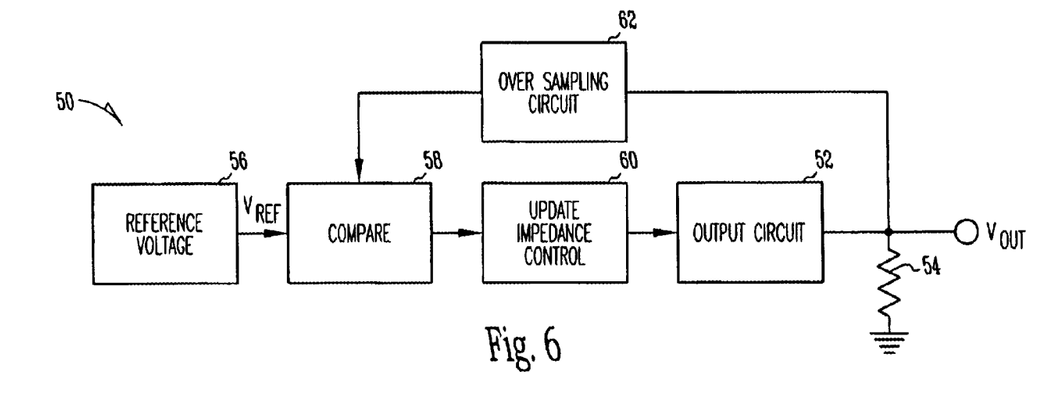

Referring now to FIGS. 4–6, there is illustrated various example embodiments of apparatus according to the present invention. FIG. 4 illustrates a first example embodiment 40 of the apparatus, wherein the impedance of a digital output circuit 44 is controlled using an all-digital impedance control circuit 42, and wherein one or more control bits are used to tune the output impedance. According to a further aspect of this embodiment, the impedance control circuit is fabricated using circuit components found in a standard macro library of a computer aided design system.

Referring now, to FIG. 5, there is illustrated another example embodiment 50 of the apparatus of the present invention, wherein there is provided an impedance control circuit for an output driver on an integrated circuit ("IC") device. According to this embodiment, a resistor divider network 55 is formed with the output driver circuit 52 and a resistor 54 off the IC device so that the divider network 55 produces an output voltage Vout, and the output voltage of the divider network is compared with a reference voltage Vref. The output impedance of the output driver circuit 52 is adjusted with the impedance update circuit 59 to attempt to match the output voltage Vout of the divider network 55 and the reference voltage Vref.

According to another example embodiment 60 shown in FIG. 6, the divider network is over-sampled with sampling circuit 62 which stores the results and repeats this process in order to average the results over multiple sampling operations. Further, in this or the other example apparatus embodiments described above, the impedance is controlled with a plurality of bits forming a word, and the value of the word is updated by only one least significant bit at a time.

According to one example aspect of this apparatus, a sequencer is used to determine when to update the bits. According to another example aspect, the sequencer is disabled to monitor the updating of the bits or to cause all updates to be sent to system drivers. According to yet another example aspect of the apparatus, the control mechanisms are monitored and overridden by test data registers. According to yet another example aspect, a mid count is used to bypass the sampler for test purposes during system operation.

Figure 7A:
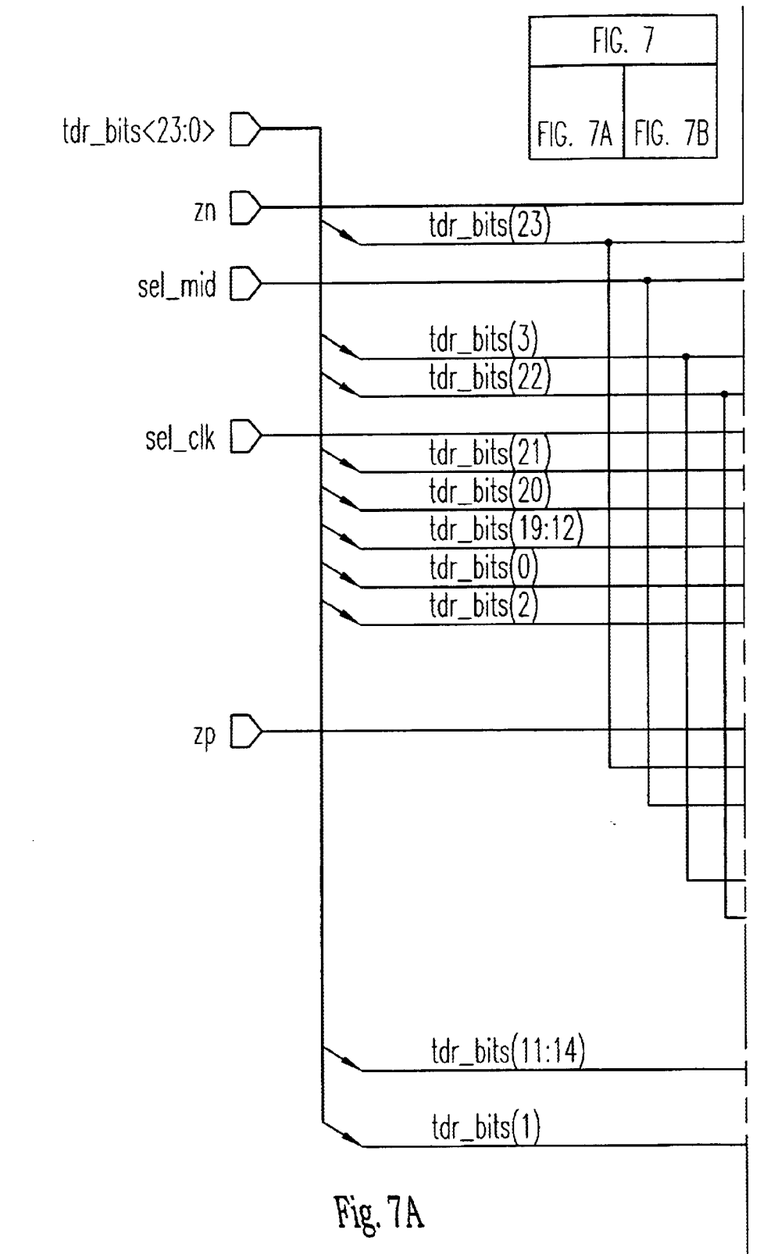
FIGS. 7–11, 12A–12B, 13A–13B and 14 illustrate further example embodiments of apparatus according to the present invention.
Figure 7B:
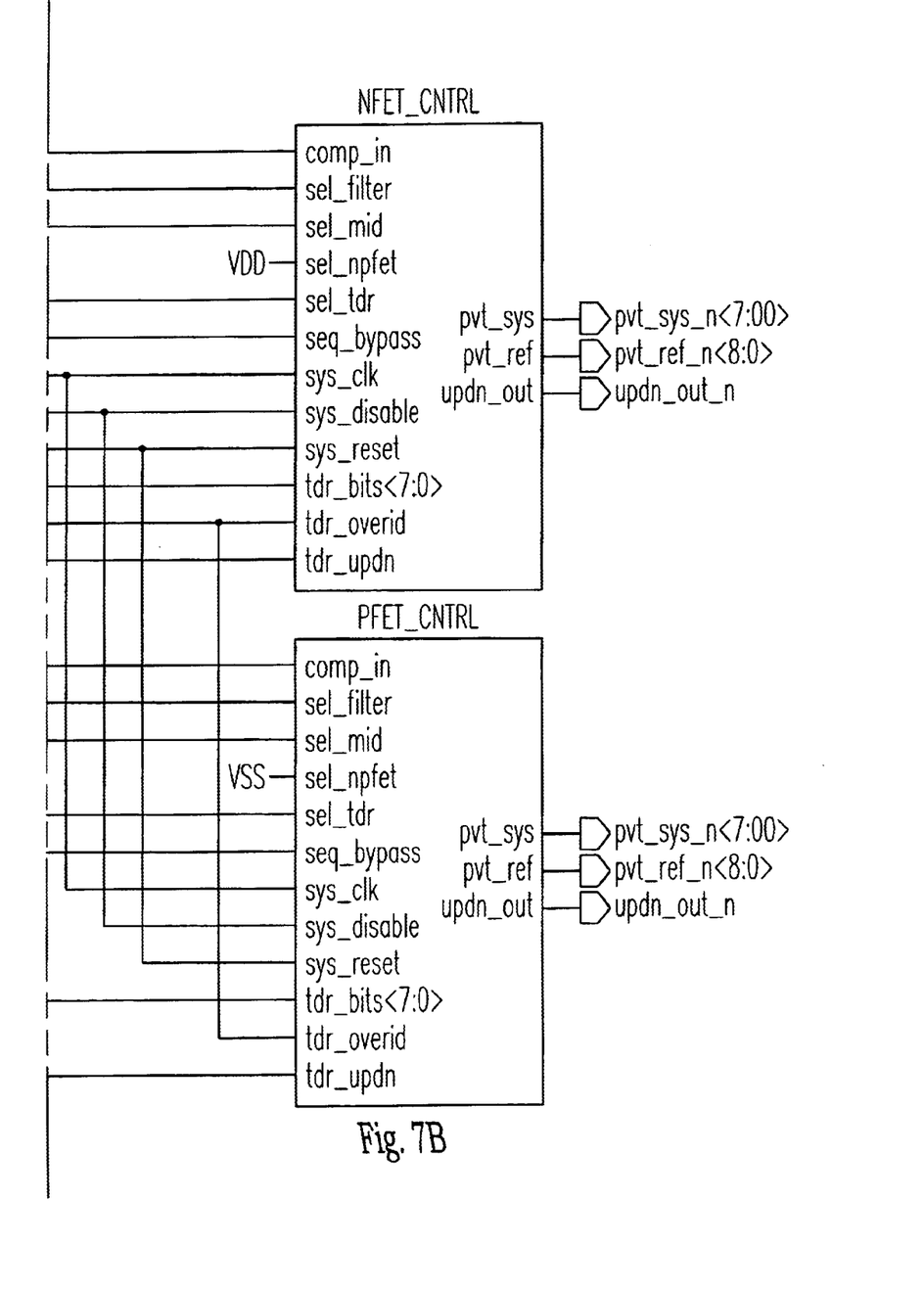
Figure 8:
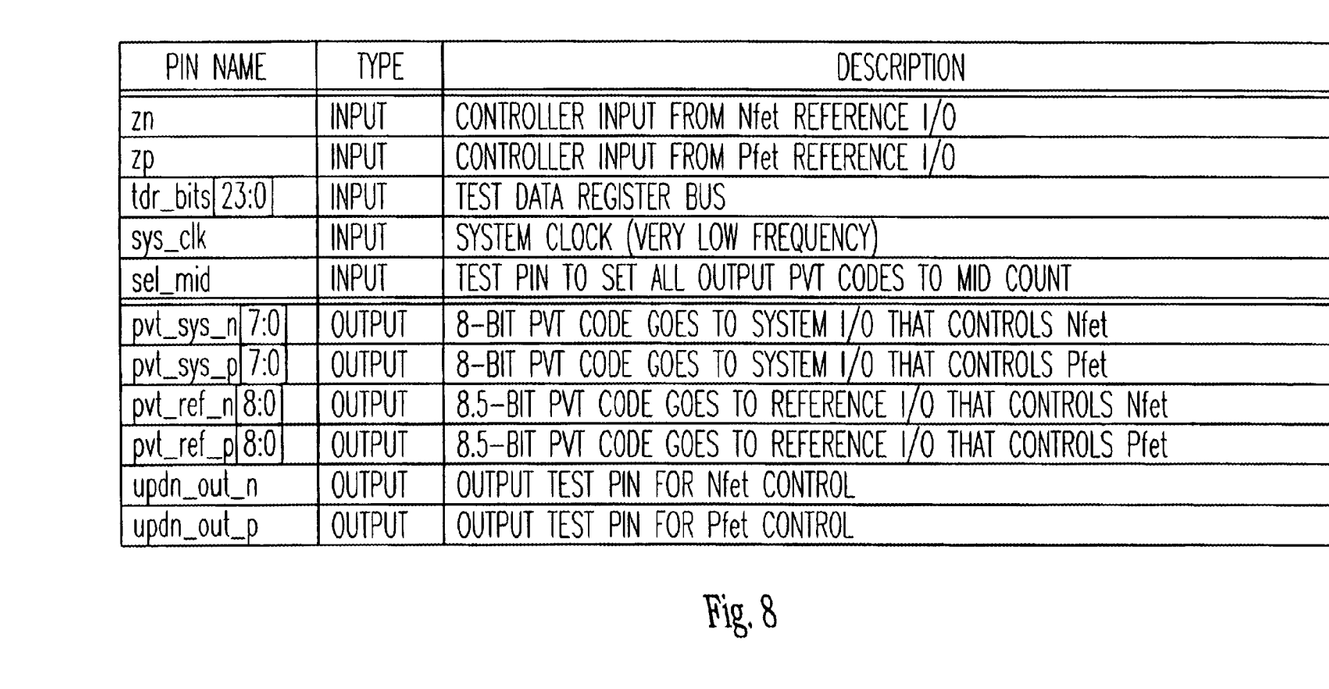

Referring now to FIGS. 7–14, there is illustrated further example embodiments of the invention wherein the impedance controller is a RLM macro used to generate the digital code to the input control bits (referred to for example as "PVT code" herein below) of an output circuit module, wherein the input control bits specify the output impedance characteristics of the output circuit module (for example the "APF I/O" circuits described in co-pending application entitled "Method and Apparatus for Communicating Computer Data from One Point to Another Over a Communications Medium," filed on even date herewith, and assigned to the same assignee as the present patent) so that a correct output impedance is produced by the output circuit over all process, voltage, and temperature environments. A top level block diagram of an impedance controller for such a module is shown in FIG. 7. It consists of two identical logic blocks called icntrl herein, one for the Nfet control, and the other one for Pfet control. FIG. 8 is a table giving the pin assignments for an impedance controller according to this example embodiment. The detail implementation of icntrl is discuss below.

Figure 9:
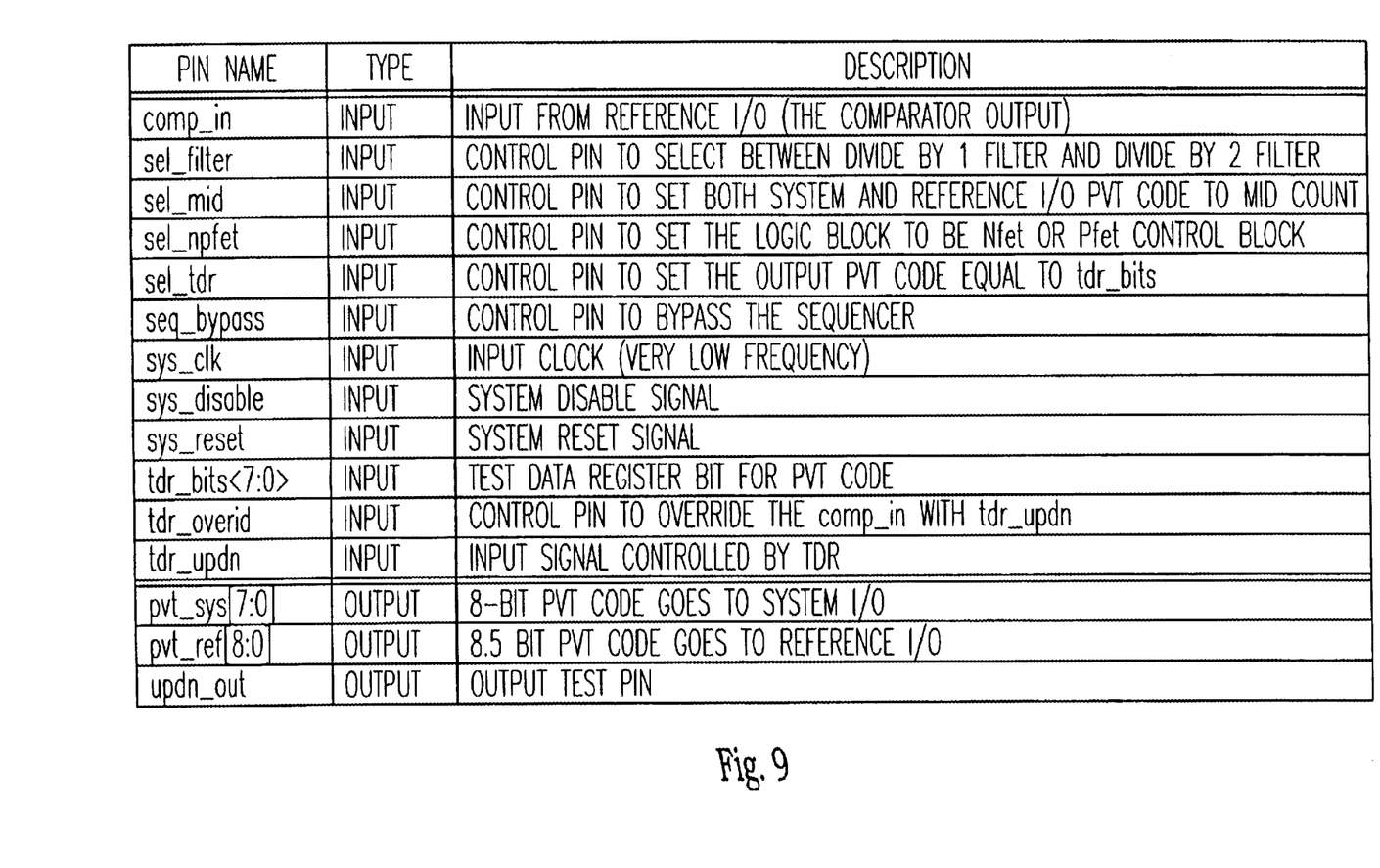

FIG. 9 gives a brief description of the input and output pin assignment of the logic block icntrl. FIG. 7 illustrates the mapping between the 24 Test Data Register bits to the input of control. Input pin, sel_npfet is hardwired to VDD for Nfet control and to VSS for Pfet control. Output pin, pvt_sys is the 8-bit PVT code goes to the system I/O, bit O is the base bit, and is always at VDD; pvt ref is the 8.5-bit PVT code goes to the reference I/O, bit O is the half bit and bit 1 is the base bit which is always on.

Figure 11A:
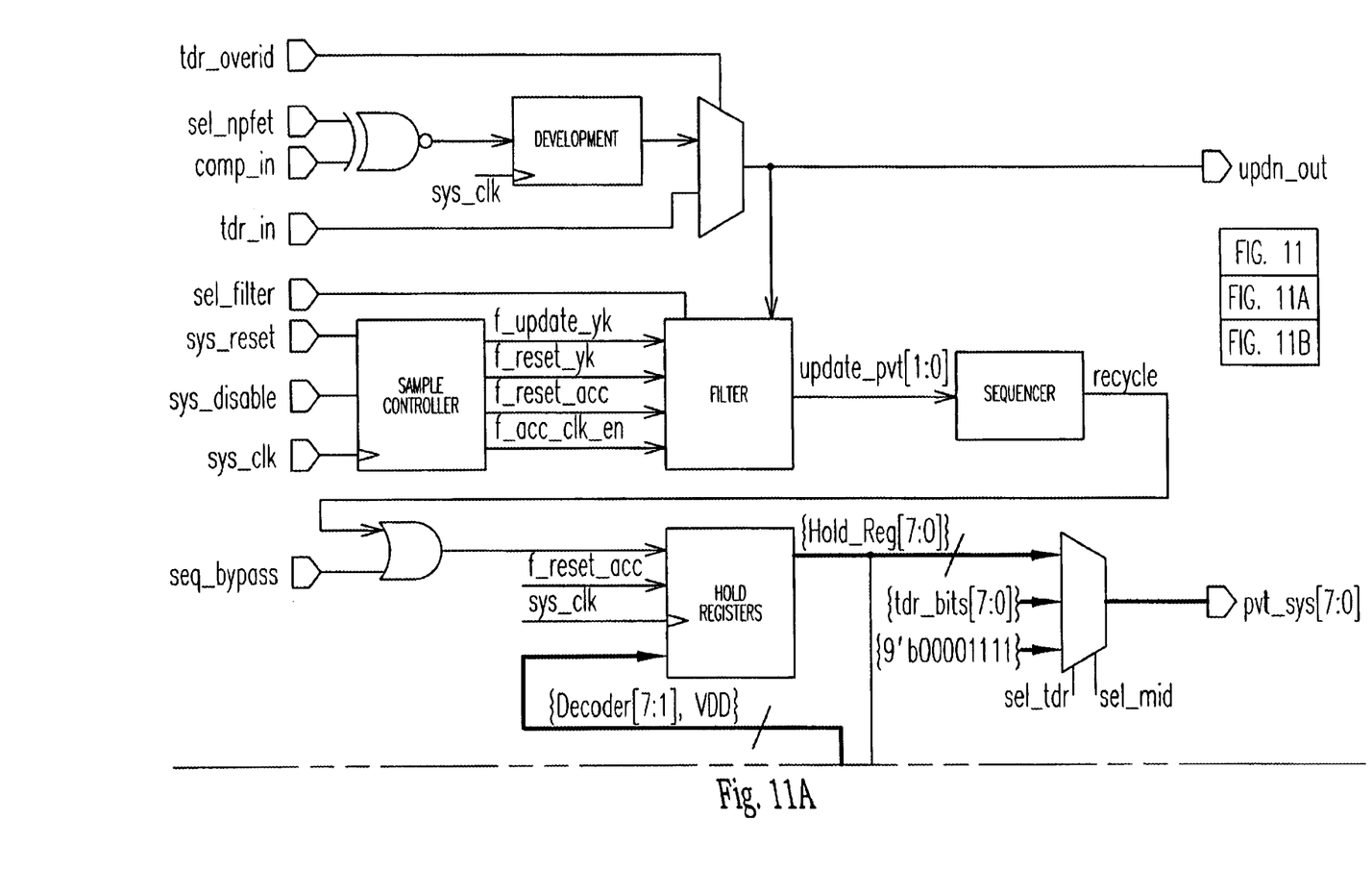
Figure 11B:
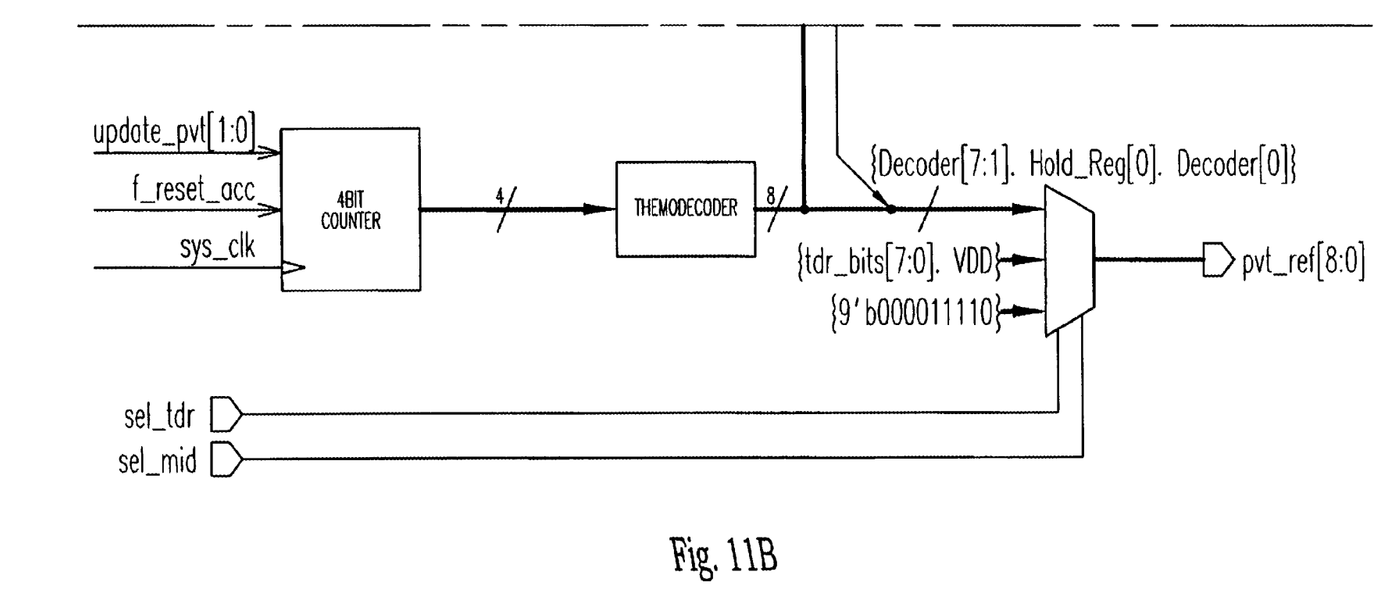

As shown in FIG. 11 block cntrl is made up of several logic sections, as follows:

In the input stage the input signal from reference I/O is latched with sys_clk running at very low frequency. In this section, Control pin, sel_npfet is used to either buffering or inverting the input signal, it determines if the controller is used to control nfet or pfet accordingly. Control pin, tdr_overid is used to override the input signal from reference I/O with tdr_in, signal controller by the JTAG TDR(test data register).

Figure 10:
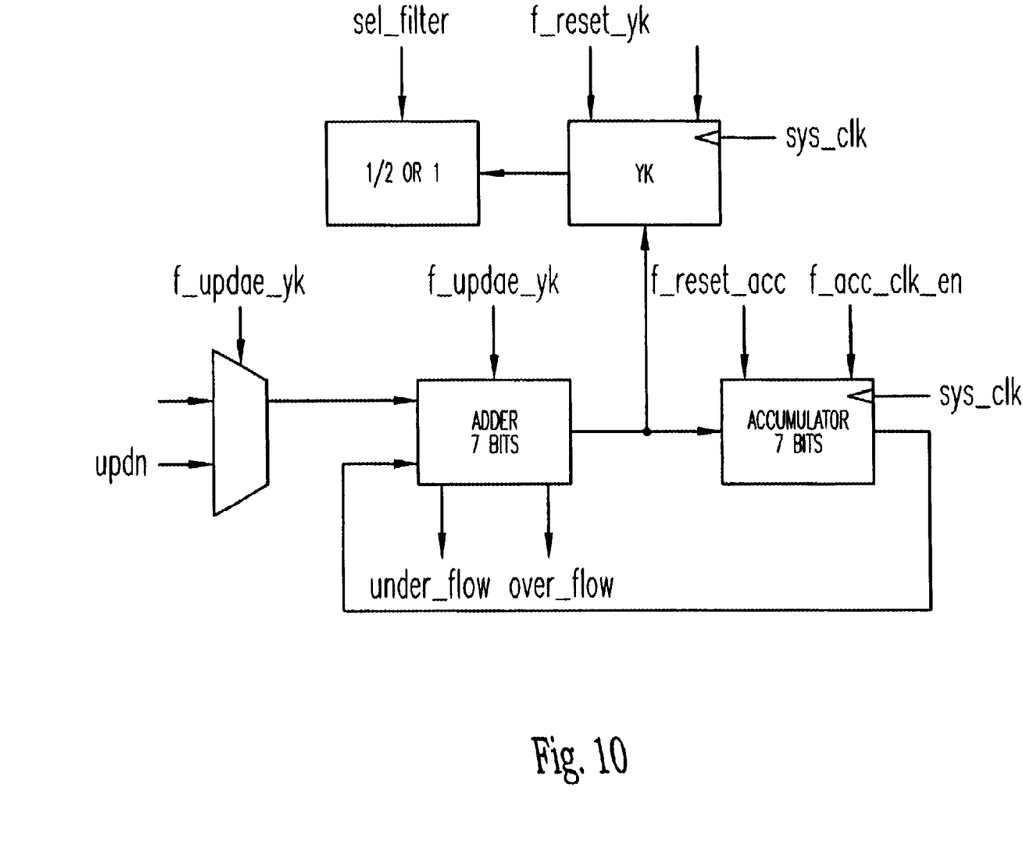

The filtering stage, due to presence of noise, uses two digital filters to process the signal from input section. Control pin sel_filter is used to select between these two filters. The detail block diagram of the filters is illustrated in FIG. 10, implementing Yk=ak+a*Yk−1, where a is ½ or 1 depending on sel_filter. The sequence in which the filter operates is controlled by four internal signals: f_updated_yk, f_reset_yk, f_reset_acc, f_acc_clk_en. These four signals are generated in Sampling Controller where a 7-bit binary counter is implemented. f_reset_yk is tied to sys_reset pin, and f_acc_clk_en is teid to the inverse of sys_disable. f_update_yk is active during full count, and f_reset_acc is active druing zero count. During initial system reset, Sampling Counter is set to zero count; f_reset_yk and f_reset_acc are active which set the Yk register and accumulator to zero. After reset, Sampling Counter starts counting up and accumulator starts to accumulate input samples either by adding to or subtracting from it through Adder. When Sampling Counter count up to full count, f_udpate_yk is active, the current value of the Adder is passed to Yk register, and previous value stored in Yk register (Yk−1) is divided by 1 or 2, depending on the selection of the filter and added with the value in Accumulator (Yk) through Adder. The value of Adder, sum of Yk+a*Yk−1 is examined, if overflow occurs, over_flow signal is set, and if underflow occurs, under_flow signal is set. These two signals are passed to Sequencer to register the sequence, and to 4 bit counter to counting up or down accordingly to produce a higher or lower pvt code. if either overflow or underflow occur, Yk register is set to zero, otherwise, current value of Yk is kept which will become Yk−1 next time around. When Sampling Counter reach zero count again, f_reset_acc is set and the whole process described above starts over again.

In the sequencer section, several sequences where pvt code toggling back and forth around the correct pvt code are recognized and a recycle signal is produced upon recognition to lock in those pvt code that goes to the system I/O.

The 4 bit Counter operates such that depending on whether overflow is set or underflow is set, this binary counter will count up and down to produce a new PVT code.

In the Thermodecoder section, the actual PVT code is decoded from 4 bit binary counter. It ensures that only one bit of 8 bit PVT code changes state at one time when 4 bit binary counter update to a new PVT code.

The Hold Resiger section consists of a set of latches clocked by the sys_clk to produce latched version of PVT code, and hold the PVT code if recycle signal from sequencer goes low. The hold feature can be deactivated by setting the seq_bypass pin low.

The Output Stage section is basically a 3 to 1 mux selecting among the generated PVT code, tdr_bits, and mid count bits controlled by 2 input pins, sel_tdr and sel_mid.

Figure 12A:
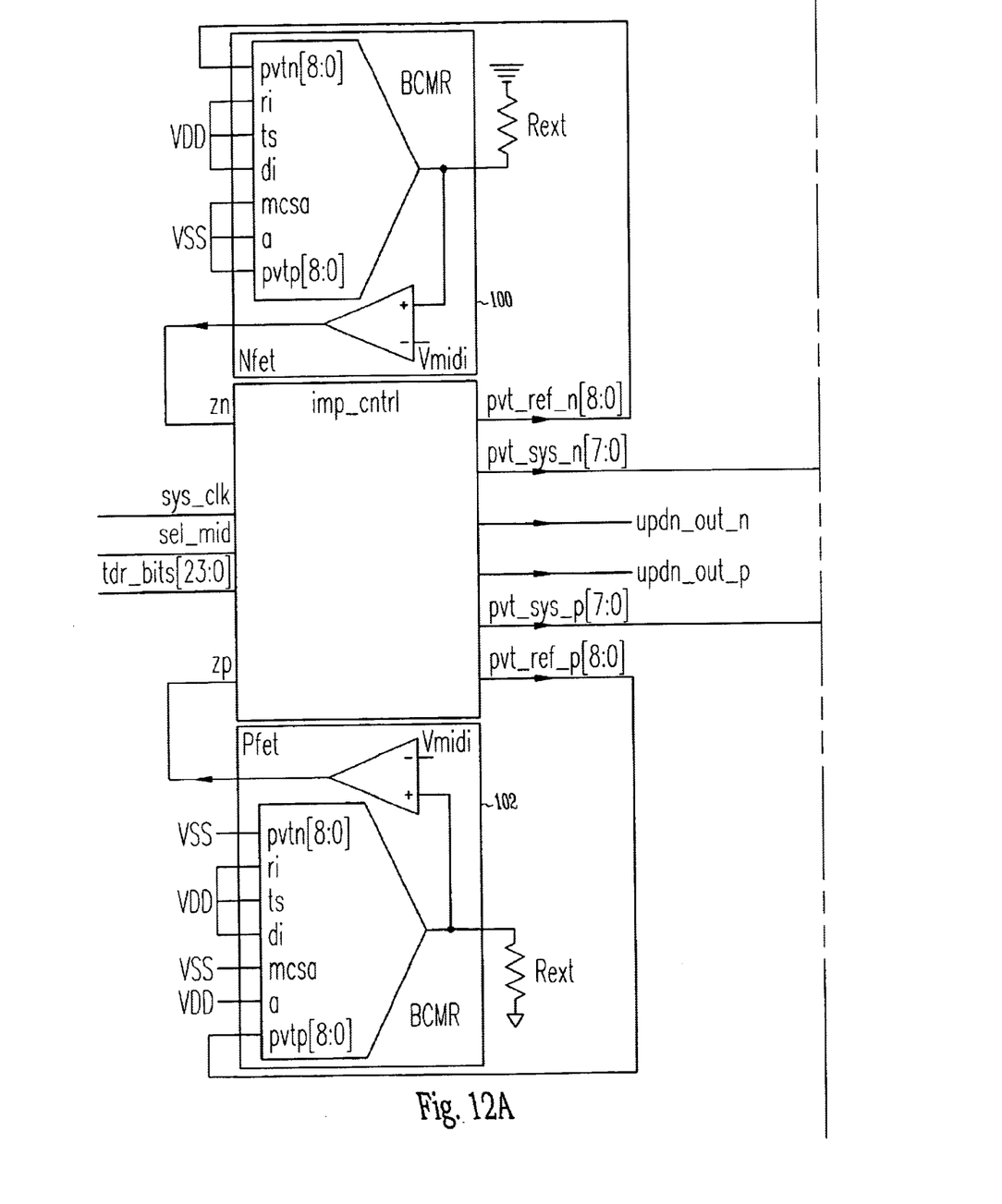
Figure 12B:
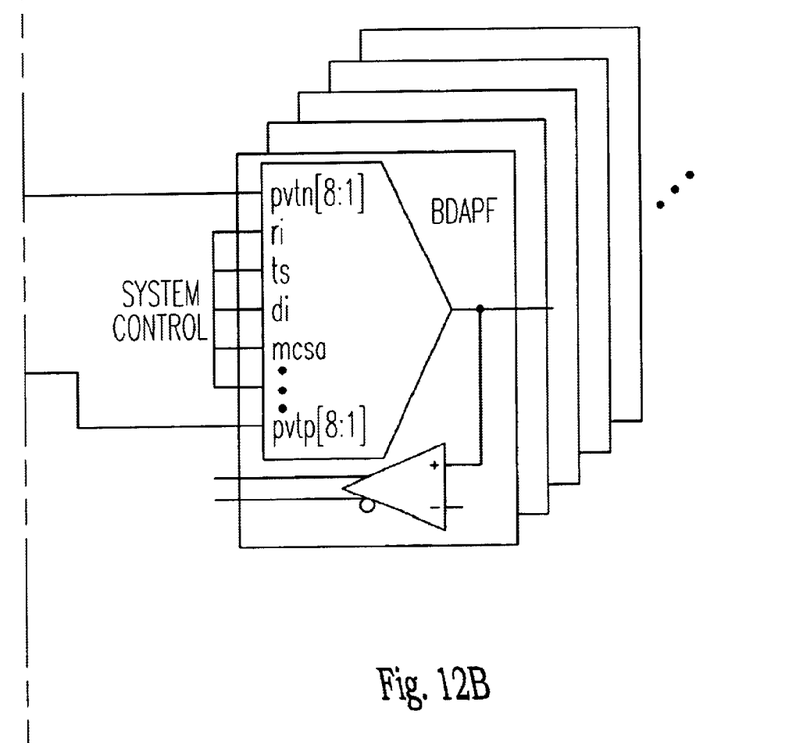

FIGS. 12A–12B illustrate the hook up of the impedance controller and an I/O circuit with the $R_{on}$ of the Pfet 102 equal to the $R_{on}$ of Nfet 100.

Figure 13A:
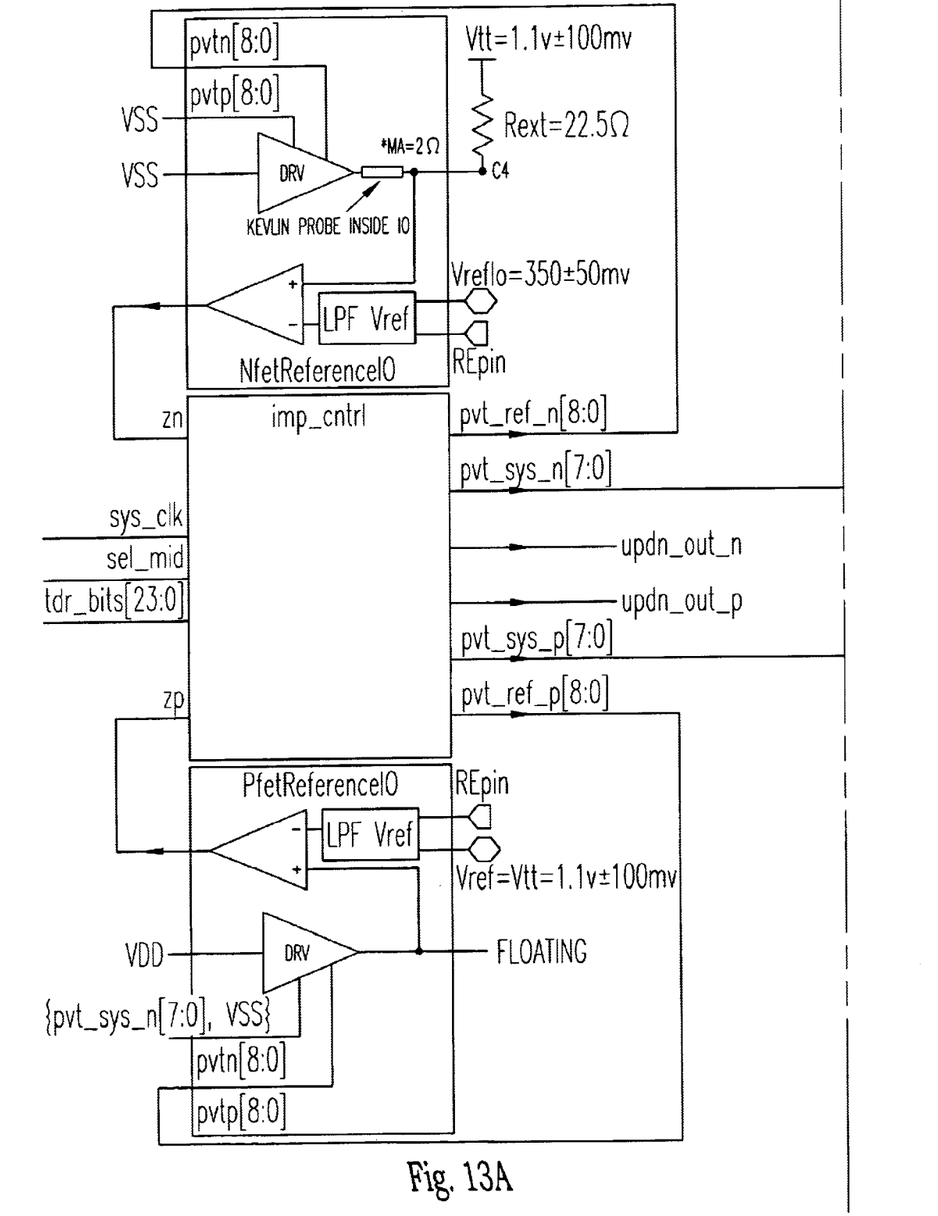
Figure 13B:
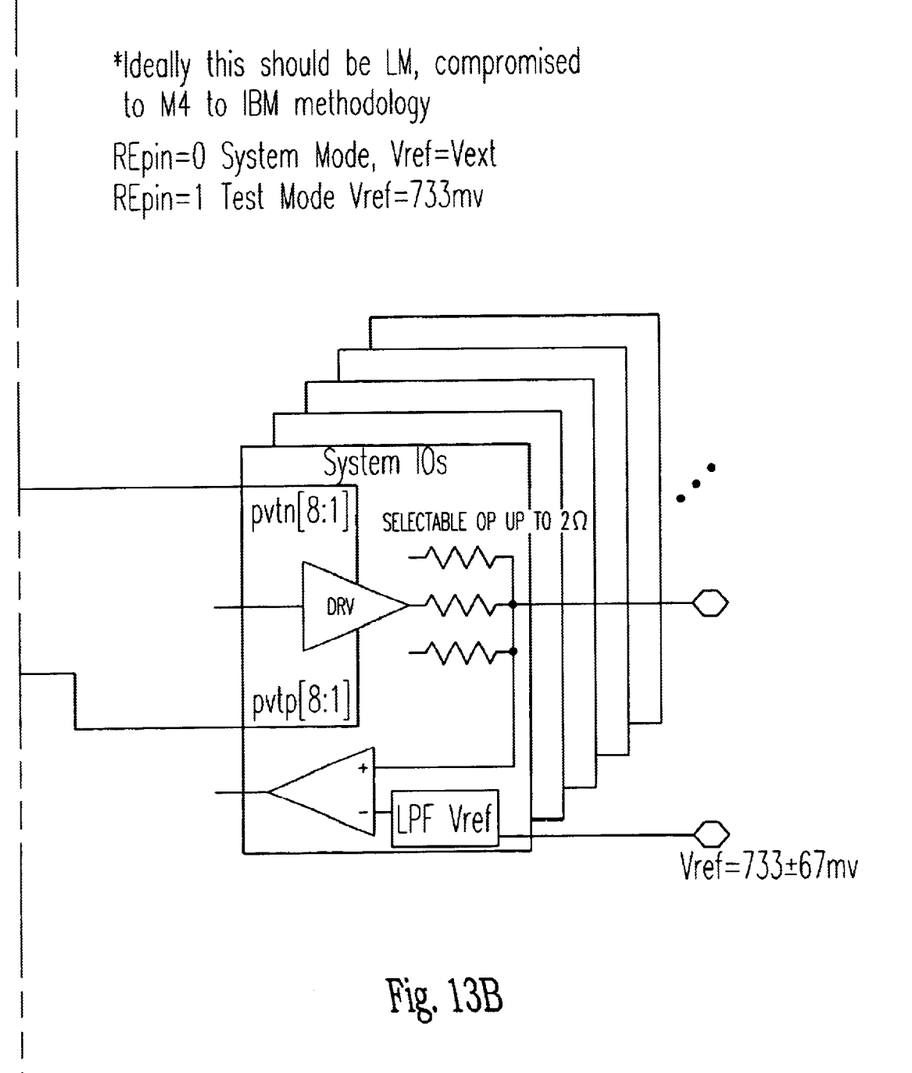
Figure 14:
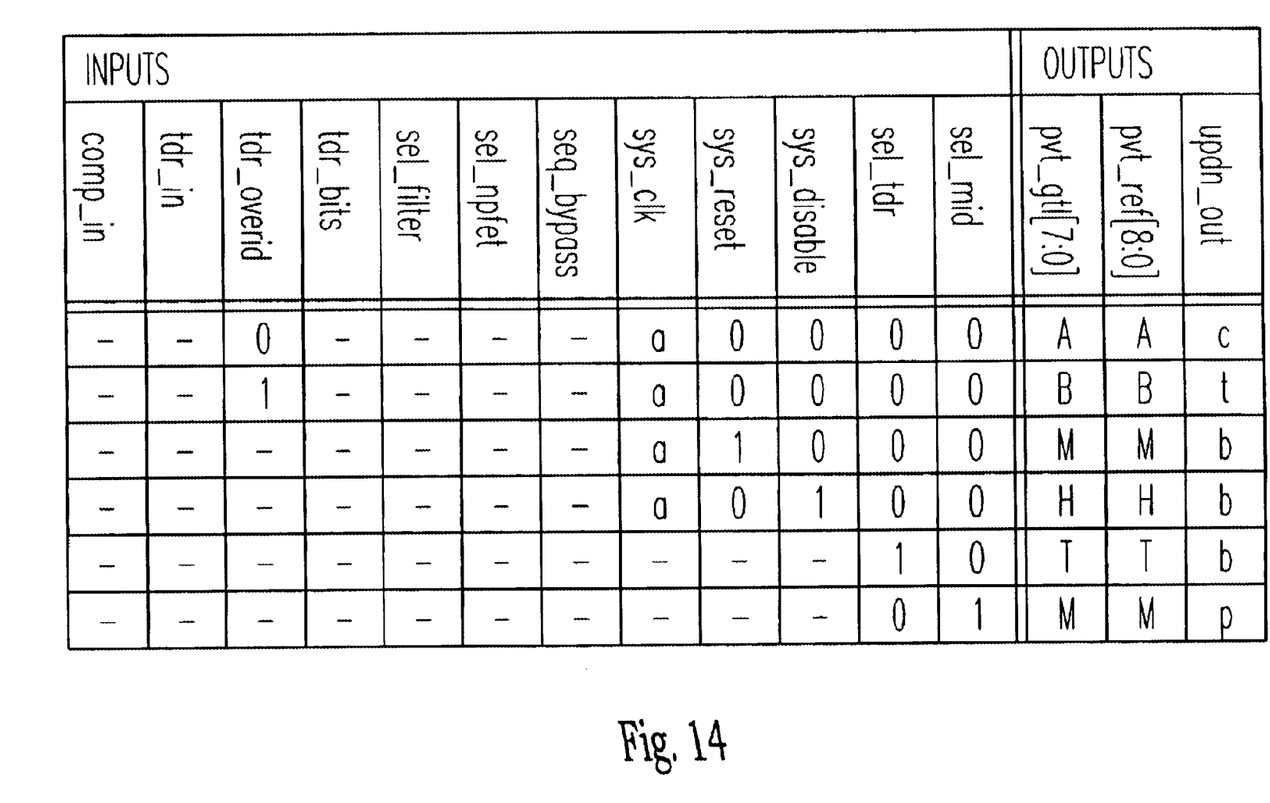

FIGS. 13A–13B illustrate the hook up of the impedance controller and a I/O circuit who's impedance is symmetric like GTL+. Where the $R_{on}$ resistance of the Nfet is only 7 ohm, but the $R_{on}$ of the Pfet is 35 ohm. In this embodiment the pad transfer impedance is also accounted for in the Nfet reference IO. The GTL+driver is described in "GTL+ Driver" U.S. patent application Ser. No.: 09/620,679, filed herewith, the description of which is incorporated herein by reference.

EXAMPLE OPERATION

The APF impedance controller(imp_cntrl) along with BCMR(reference IO) and BDAPF(system IO) form a close loop for the normal operation, where impedance controll take the feedback from reference IO, generate and update the proper PVT code to both reference and system IOs. The operation of one icntrl controller logic is described in the truth table of FIG. 13.

The PVT code provided by the Impedance Controller can be preloaded in 4 ways:

1. When sys_clk is running, if sys_disable is low, sys_reset is held high. All the counters will be set to the mid count. The thermodecoder will hold the pvt code to mid count. If sys_disable is high or if the sys_clk is stopped, all the registers in the controller are inactive, and hold it's previous value, PVT code will be keep constant.

2. When control pin tdr_overid is held high by the JTAG TDR(Test Data Register), input from reference IO(comp_in) will be overridden by the tdr_in. It is controlled by the JTAG and is toggled to the PVT count desired.

3. When control pin sel_tdr is held high by the JTAG TDR, PVT code will be replaced by what is in the tdr_bits.

4. When control pin sel_mid count is high, PVT code will be set to mid count.

According to one example embodiment of the invention, a clock of 10 Mhz or less is used, with 6.25 Mhz being one preferred rate. In addition, edge rate and skew meet IBMs SA-27E lowest requirements in another embodiment. In one sample embodiment, just another RLM, not wired RLM. According to another embodiment, one impedance controller is required for each NI channel, ad the BCMR I/Os used as a impedance reference I/Os must be in the center of the NI I/Os to trace their PVT. According to another example embodiment, the controller logic can be placed anywhere. The padxfer metal must match the padxfer metal of the NI I/Os in that channel. According to yet another example embodiment, the Estimated cell count is 10 k cells. In still yet another example embodiment, during normal operation, sys_clk should be active and running at very low frequency (suggested 6.25 mhz), sys_reset and sys_disable should be set to low. In this scenario, the controller will update to a new set of PVT code every 256 cycle or 41 us(assuming sys_clk running at 6.25 mhz).

What is claimed is:

1. Apparatus for controlling the impedance of an output driver on an integrated circuit ("IC") device comprising:

a resistor divider network formed with the output driver and a resistor, the resistor being off the IC device so that the resistor divider network produces an output voltage, a comparing circuit producing a signal indicative of a comparison of the output voltage of the resistor divider network with a reference voltage, a control circuit producing one or more control signals wherein the control signals adjust the output impedance of the output driver to attempt to match the output voltage of the resistor divider network and the reference voltage, and wherein the comparing circuit includes components that over-sample the divider network voltage, store the results of the over-sampling, repeats the over-sampling and storing, and averages the results of multiple over-sampling operations.

2. Apparatus for controlling the impedance of an output driver on an integrated circuit ("IC") device comprising:

a resistor divider network formed with the output driver and a resistor, the resistor being off the IC device so that the resistor divider network produces an output voltage, a comparing circuit producing a signal indicative of a comparison of the output voltage of the resistor divider network with a reference voltage, a control circuit producing one or more control signals wherein the control signals adjust the output impedance of the output driver to attempt to match the output voltage of the resistor divider network and the reference voltage, wherein the output driver is responsive to a plurality of bits forming a word, and the controller produces updates to the value of the word by only one least significant bit at a time, and a sequencer that determines when to update the bits.

3. Apparatus according to claim 2 further comprising a disabling circuit to disable the sequencer to allow monitoring of the updating of the bits or to cause all updates to be sent to system drivers.

4. Apparatus according to claim 2 wherein the control circuit is responsive to at least one signal to be monitored and overridden by test data registers.

5. Apparatus according to claim 2 further comprising a circuit for holding a mid count by bypassing the sequencer.

6. A method of impedance control for an output driver on an integrated circuit ("IC") device comprising:

forming a resistor divider network with the output driver and a resistor, the resistor being off the IC device so that the resistor divider network produces an output voltage, comparing the output voltage of the resistor divider network with a reference voltage, adjusting the impedance of the output driver to attempt to match the output voltage of the resistor divider network and the reference voltage;

over-sampling the divider network voltage, storing the results of the over-sampling, repeating the over-sampling and storing, and averaging the results of multiple over-sampling operations.

7. A method of impedance control for an output driver on an integrated circuit ("IC") device comprising:

forming a resistor divider network with the output driver and a resistor, the resistor being off the IC device so that the resistor divider network produces an output voltage, comparing the output voltage of the resistor divider network with a reference voltage, and adjusting the impedance of the output driver to attempt to match the output voltage of the resistor divider network and the reference voltage, wherein the impedance of the output driver is controlled by a plurality of bits forming a word, and including updating the value of the word by only one least significant bit at a time, and using a sequencer to determine when to update the bits.

8. A method according to claim 7, including disabling the sequencer to monitor the updating of the bits or to cause all updates to be sent to system drivers.

9. A method according to claim 7 including holding a mid count by bypassing the sequencer for test purposes during system operation.

* * * * *